United States Patent [19]

Kobayashi et al.

[11] Patent Number: 5,393,994
[45] Date of Patent: Feb. 28, 1995

[54] OPTICAL SEMICONDUCTOR DEVICE FOR NEURAL NETWORK

[75] Inventors: Yasuhiro Kobayashi, Osaka; Kenichi Matsuda, Moriguchi, both of Japan

[73] Assignee: Matsushita Electric Industrial Co., Ltd., Osaka, Japan

[21] Appl. No.: 192,552

[22] Filed: Feb. 7, 1994

[30] Foreign Application Priority Data

Feb. 8, 1993 [JP] Japan .................................. 5-019845

[51] Int. Cl.⁶ .......................................... H01L 31/12
[52] U.S. Cl. ........................................ 257/84; 257/85;
  257/98; 372/50; 372/48; 395/24; 395/25
[58] Field of Search ............... 257/84, 85, 98; 372/50,
  372/48; 395/24, 25

[56] References Cited

U.S. PATENT DOCUMENTS

| | | | |
|---|---|---|---|
| 4,989,214 | 1/1991 | Kwa | 372/50 |
| 5,014,096 | 5/1991 | Matsuda et al. | 395/25 X |
| 5,216,686 | 6/1993 | Holm et al. | 372/50 X |

FOREIGN PATENT DOCUMENTS 61-30089  2/1986  Japan ..................................... 372/50

OTHER PUBLICATIONS

Shibata et al., "Monolithic Integration of an InGaAsP-/InP Laser Diode with Heterojunction Bipolar Transistors," *Appl. Phys. Lett.* 45(3), 1 Aug. 1984, pp. 191–193.
Chen et al., "Vertical Integration of an InGaAsP/InP Heterojunction Bipolar Transistor and a Double Heterojunction Laser", *Appl. Phys. Lett.* 50(14), 6 Apr. 1987, pp. 874–876.
Matsueda et al., "Integration of a Laser Diode and a Twin FET", Proceedings of the 12th Conference on Solid State Devices, Tokyo 1980, Japanese Journal of Applied Physics, vol. 20, Supplement 20-1, 1981, pp. 193–197.
Y. Nitta et al., "Optical Neurochip with Learning Capability", *IEEE Photonics Technology Letters*, vol. 4, No. 3, pp. 247–249, Mar. 1992.
S. Noda et al., "Optical Amplification and Switching Devices by Integration of Optoelectronic Devices", *Institute of Electronics, information and communication Engineers Technical Report*, OQE-91-53, pp. 45–50, Jul. 26, 1991.

*Primary Examiner*—William Mintel
*Attorney, Agent, or Firm*—Ratner & Prestia

[57] ABSTRACT

An optical semiconductor device is disclosed which includes a semiconductor laser having at least an active layer, reflecting means formed on the semiconductor laser for reflecting internal feedback light generated from the semiconductor laser and at least two phototransistors formed on the reflecting means for detecting light having a wavelength substantially identical to that of laser light oscillated from the active layer.

17 Claims, 9 Drawing Sheets

OPTICAL SEMICONDUCTOR DEVICE FOR NEURAL NETWORK

BACKGROUND OF THE INVENTION

1. Field of the Invention

The present invention relates to an optical semiconductor device, and more specifically, to an optical semiconductor device for forming a neural network.

2. Description of the Related Art

An information processing system using a neural network is one of sophisticated parallel distributed information processing systems having learning capability which simulates the information processing in the brain. Such an information processing system having a neural network is excellent in high-speed pattern recognition and knowledge processing based on incomplete data. On the contrary, Neumann type serial information processing systems which are in major use at present are inferior for conducting such types of information processing. The information processing system having a neural network is therefore expected to be a system which can overcome the above and other disadvantages of the Neumann type serial information processing systems, and is one which has been intensely studied.

Figure 8:
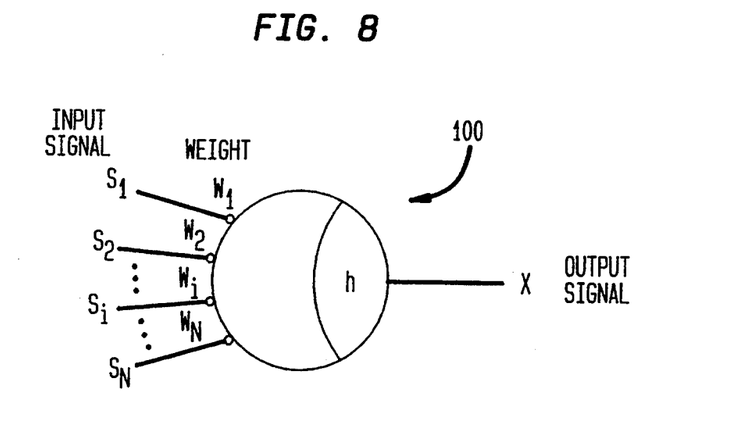
FIG. 8 is a schematic view of a neuron.

FIG. 8 schematically shows the operation of a neuron 100 to be used in a neural network. The operation of the neuron 100 is represented by formula:

$$X = 1\left[ \sum_{n=1}^{N} wi \cdot Si - h \right] \quad (1)$$

$$\text{wherein } 1[u] = \begin{cases} 1 & (u \geq 0) \\ 0 & (u < 0) \end{cases}.$$

The neuron 100 receives an input signal Si (i=1 to N) and outputs an output signal x. The input signal Si is synaptically interconnected with the neuron 100 with a strength of wi (i=1 to N) which is a weight indicating the strength of the synaptic interconnection. When the weight wi is a positive value, the synaptic interconnection is excitatory. When the weight wi is a negative value, the synaptic interconnection is inhibitory. When the weight wi is zero, there is no synaptic interconnection. When the sum Σ (Siwi) of the products of the input signal Si and the weight wi exceeds a threshold level h, the neuron 100 is made excited and outputs the output signal x. Varying the weight wi is called learning. When the weight wi varies in response to the input signal Si, the learning is called self-learning.

In order to form a neural network to complete an information processing system, a number of neurons identical to the neuron 100 are required, and they must be mutually connected. More concretely, an output signal x from another neuron not shown must be supplied to the neuron 100 as the input signal Si. As the number of neurons constituting the neural network increases, higher-level information processing is possible. However, if a number of neurons are to be mutually connected through conventional electrical wirings, the number of electrical wirings required is so enormous that it is difficult to complete the neural network using such electrical wirings. This is especially true when the neural network is composed of neurals arranged with high density.

Figure 9:
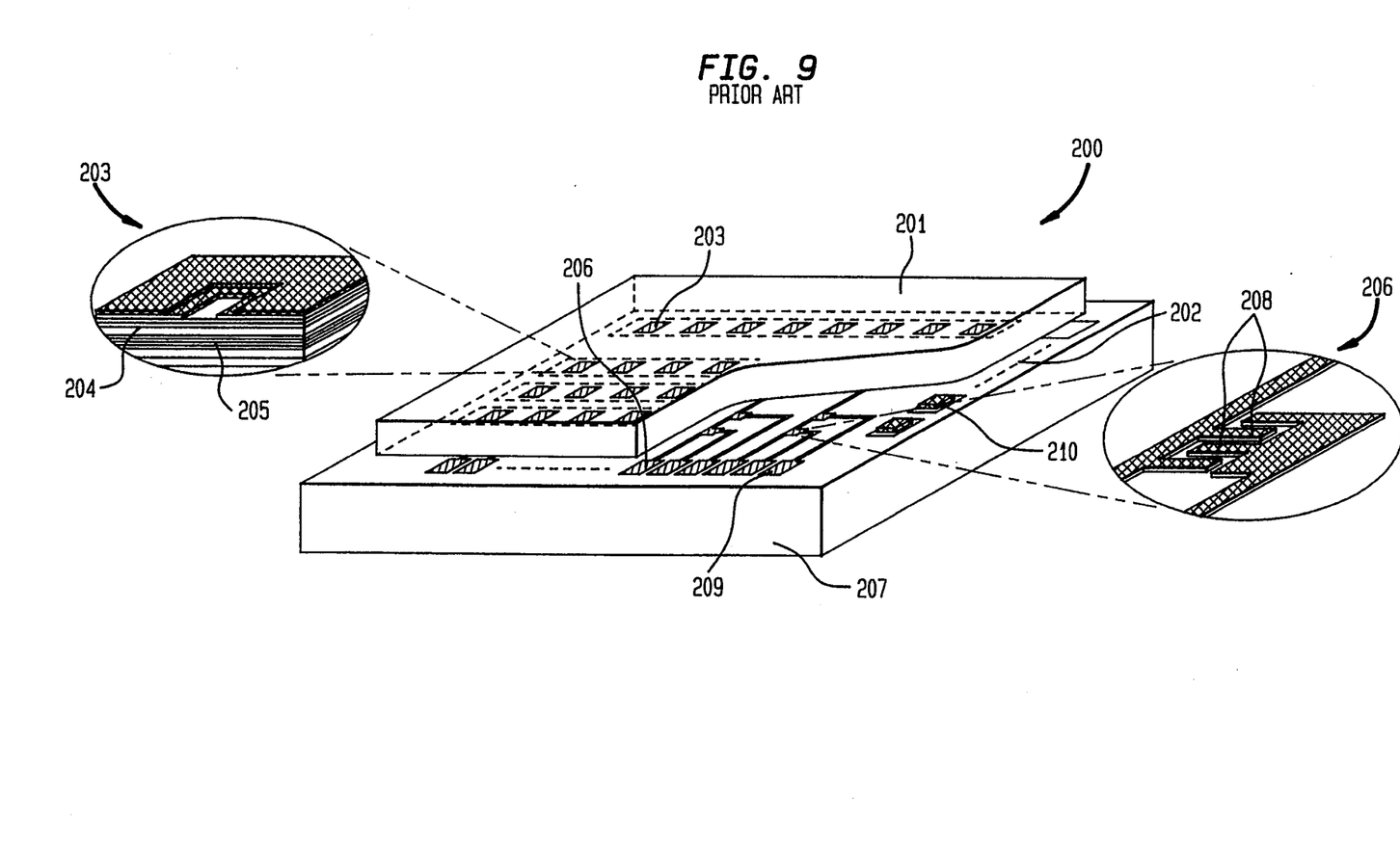
FIG. 9 is a perspective view of a conventional optical neurochip.

In order to solve the above problem, the use of light for the interconnection among a plurality of neurons has been studied. For example, IEEE Photonics Technology Letters, vol. 4 (1992), pp. 247-249 describes an optical neurochip made of semiconductor material having a light emitting device and a photodetector. FIG. 9 schematically shows such an optical neurochip 200 including a light emitting diode (LED) array 201 and a photodetector array 202. The LED array 201 consists of LEDs 203 arranged in a matrix with eight lines and eight rows. Each of the LEDs 203 includes a multi quantum-well active layer 204 and a distributed bragg reflector 205. The photodetector array 202 consists of photodetectors 206 each of which is arranged at a position corresponding to each of the LEDs 203. The photodetectors 206 having an MSM (metal-semiconductor-metal) structure are fabricated by evaporating aluminium on a GaAs substrate 207 to form electrodes 208. The electrodes 208 are connected to wire bonding pads 209 formed on the GaAs substrate 207. Bumps 210 are formed on the GaAs substrate.

In the optical neurochip 200, the eight LEDs 203 in each line simultaneously emit light having an identical intensity as the input signal Si shown in FIG. 8. This corresponds to supplying an output from one neuron to other neurons simultaneously as signals having an identical intensity. The light from the LEDs 203 is received by the corresponding photodetectors 206. In each of the photodetectors 206, a voltage is applied to one of the electrodes 208 thereof from an external source through the wire bonding pad 209. The sensitivity of the photodetectors 206 is adjustable by varying the level and the polarity of the applied voltage. This corresponds to adjusting the weight wi of the synaptic interconnection shown in FIG. 8. Each eight of the photodetectors 206 are mutually connected in a row so that the sum of photocurrents flowing in the eight photodetectors 206 can be taken out. This corresponds to obtaining the sum Σ(Siwi) of the products of the input signal Si supplied from neurons and the weight wi of the synaptic interconnection. Thus, the optical neurochip 200 has realized the synaptic interconnection.

However, the optical neurochip 200 has disadvantages as follows: First, threshold processing is not available. It is required, therefore, to provide an external operation circuit to conduct the threshold processing of the signals output from the optical neurochip 200 before being supplied to another optical neurochip. Second, since the input signals and the output signal of the optical neurochip 200 are electrical signals, electrical wirings are required for the formation of a neutral network. Thus arises the same trouble as described above.

Figure 10:
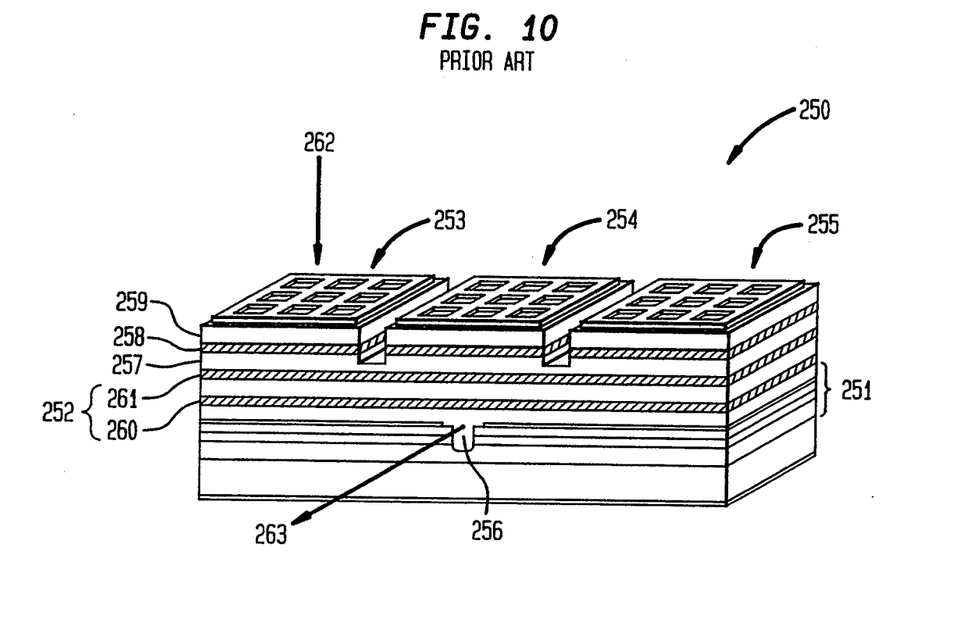
FIG. 10 is a perspective view of a conventional optical semiconductor device.

An optical semiconductor device having a photodetector and a light emitting device is described in the Institute of Electronics, information and communication Engineers Technical Report, OQE-91-53 (1991), pp. 45-50. Referring to FIG. 10, an optical semiconductor device 250 includes a semiconductor laser 251, an absorbing layer 252 formed on the semiconductor laser 251, and heterojunction phototransistors 253, 254, and 255 formed on the absorbing layer 252. The semiconductor laser 251 includes an undoped active layer 256 having a band gap of 1.3 μm. Each of the phototransistors 253 to 255 includes a collector layer 257, a base layer 258, and an emitter layer 259, which are doped with impurities at concentrations of $1 \times 10^{17}$ cm$^{-3}$, $5 \times 10^{16}$ cm$^{-3}$, and $1 \times 10^{18}$ cm$^{-3}$ respectively. The band gap of the base layer 258 is 1.2 μm. The phototransistors 253 and 255 are formed at positions shifted from the center of emission of the semiconductor laser 251 by a horizontal distance of 185 μm opposite to each other. The phototransistor 254 is formed above the center of emission of the semiconductor laser 251. The absorbing layer 252 includes a first absorbing layer 260 having a thickness of 1 μm and a band gap of 1.2 μm and a second absorbing layer 261 having a thickness of 1 μm and a band gap of 1.3 μm.

In the optical semiconductor device 250 having the above-described structure, when the phototransistor 253 is irradiated with an input beam 262, a photocurrent is generated. The photocurrent then flows into the semiconductor laser 251 and causes laser oscillation. In general, a semiconductor laser emits weak light even when the current flowing therein is too small to cause laser oscillation. In the optical semiconductor device 250, therefore, if the semiconductor laser 251 emits weak light without generating laser oscillation, the emitted light will be absorbed into the phototransistors 253 to 255 as feedback light, resulting in production of a large photocurrent. This large photocurrent will cause the semiconductor laser 251 to emit light more intensely. With this positive optical feedback, the semiconductor laser 251 will finally oscillate, which will prevent the semiconductor device 250 from conducting normal optical amplification operations.

In order to solve the above problem, the active layer 256 of the semiconductor laser 251 is formed of a semiconductor material different from that for the base layers 258 of the phototransistors 253 to 255. Thus, the wavelength of light oscillated by the semiconductor laser 251 is different from the detection peak wavelength of the phototransistors 253 to 255. Further, the absorbing layer 252 is provided in order to minimize the influence of internal feedback light.

With the above structure, however, the phototransistor 254 formed above the center of emission of the semiconductor laser 251 still receives internal feedback light. Therefore, in order to substantially eliminate the influence of internal feedback light, the phototransistor 253 (or 255) which is formed at a position shifted from the center of emission of the semiconductor laser 251 is used as the photodetector.

Thus, in the optical semiconductor device 250, the phototransistor 253 is used as the photodetector, and the current is biased by dark current to a level slightly lower than that at which the semiconductor laser 251 starts oscillating. Under these conditions, when an input beam 262 is incident to the phototransistor 253, the semiconductor laser 251 oscillates and outputs an output beam 263. Since the semiconductor laser 251 has an output light-current characteristic with good linearity, an output beam 263 with high intensity can be obtained even when the input beam 262 is weak, allowing the optical semiconductor device 250 to conduct the optical amplification operation.

However, the optical semiconductor device 250 is still disadvantageous for use as a neuron constituting a neutral network for the following reasons:

The wavelength of the light emitted from the semiconductor laser 251is different from the detection peak wavelength of the phototransistor 253. Accordingly, when the output beam 263 is introduced to a phototransistor of another optical semiconductor device as an input beam, the detection sensitivity lowers, and therefore it is difficult to form a neural network with effective signal transmission. Further, since the phototransistor 254 formed above the center of emission of the semiconductor laser 251 cannot be used as the photodetector, high-density integration of the optical semiconductor device 250 cannot be realized.

SUMMARY OF THE INVENTION

The optical semiconductor device of this invention includes: a semiconductor laser having at least an active layer; reflecting means formed on the semiconductor laser for reflecting internal feedback light generated from the semiconductor laser; and at least two phototransistors formed on the reflecting means for detecting light having a wavelength substantially identical to that of laser light oscillated from the active layer.

Alternatively, the optical semiconductor device of the present invention includes: a plurality of semiconductor lasers each having at least an active layer; reflecting means formed on each of the plurality of semiconductor lasers for reflecting internal feedback light generated from the semiconductor laser; and at least two phototransistors formed on the reflecting means for detecting light having a wavelength substantially identical to that of laser light oscillated from the active layer.

According to another aspect of the present invention, an optical neurochip is provided, which includes: a plurality of optical semiconductor devices each including; a plurality of semiconductor lasers each having at least an active layer; reflecting means formed on each of the plurality of semiconductor lasers for reflecting internal feedback light generated from the semiconductor laser; at least two phototransistors formed on the reflecting means for detecting light having a wavelength substantially identical to that of laser light oscillated from the active layer; and voltage application means for applying bias voltages to the phototransistors; and a bias control circuit optically connected to each of the semiconductor lasers and each of the phototransistors, for detecting light oscillated from the semiconductor laser and applying a voltage corresponding to the intensity of the detected light to the voltage application means.

The optical semiconductor device of the present invention includes a plurality of phototransistors having a symmetrical heterojunction structure formed on the semiconductor laser. The phototransistors are capable of responding to output light emitted outside from the semiconductor laser, but are prevented from absorbing internal feedback light therefrom.

The semiconductor laser is a semiconductor light emitting device which outputs coherent light when the current flowing in the device exceeds a threshold level specific to the device. The heterojunction phototransistor is a semiconductor photodetector which can obtain a photocurrent corresponding to the intensity of input light and has a gain. Accordingly, with the above structure of the present invention, when the phototransistors receive light inputs, photocurrents are generated corresponding to the respective light inputs and flow in the phototransistors. All of such photocurrents then flow into the semiconductor laser. When the sum of the photocurrents exceeds a predetermined threshold level, the semiconductor laser oscillates and outputs light.

In the optical semiconductor device of the present invention, internal feedback light from the semiconductor laser is prevented from being absorbed by the heterojunction phototransistors. Accordingly, it is possible for the semiconductor laser to emit light with a wavelength identical to that of the input light incident to the phototransistors. This enables connection of a plurality of identical optical semiconductor devices to complete an optical neural network. This also makes it possible to dispose the phototransistors right above an active region of the semiconductor laser, allowing for high-density integration of the phototransistors on the semiconductor laser.

Thus, the invention described herein makes possible the advantages of (1) providing an optical semiconductor device in which threshold processing by the device itself is possible, (2) providing an optical semiconductor device of which input light and output light have an identical wavelength, and (3) providing an optical semiconductor device in which the influence of internal feedback light is minimized and thus phototransistors can be integrated with high density.

These and other advantages of the present invention will become apparent to those skilled in the art upon reading and understanding the following detailed description with reference to the accompanying figures.

DESCRIPTION OF THE PREFERRED EMBODIMENTS

Example 1

Figure 1:
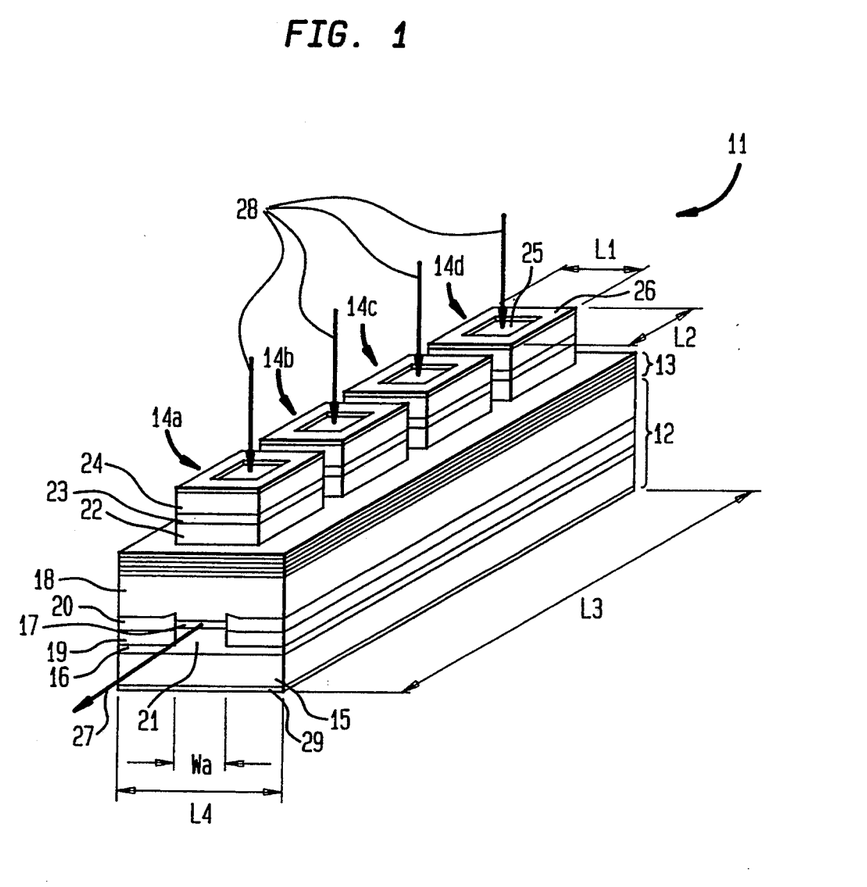
FIG. 1 is a perspective view of a first example of the optical semiconductor device according to the present invention.

FIG. 1 shows a first example of the optical semiconductor device of the present invention. An optical semiconductor device 11 includes a semiconductor laser 12, a semiconductor reflecting mirror 13 formed on the semiconductor laser 12, and phototransistors 14a, 14b, 14c, and 14d formed on the semiconductor reflecting mirror 13.

The semiconductor laser 12 includes a p-type semiconductor substrate 15, a p-type cladding layer 16 formed on the p-type semiconductor substrate 15, an active layer 17 formed on the p-type cladding layer 16, and an n-type cladding layer 18 formed on the active layer 17. The semiconductor laser 12 has a stripe buried structure. More specifically, an area of the semiconductor laser 12 including the active layer 17, part of the p-type cladding layer 16, and part of the n-type cladding layer 18 is partly etched so that a stripe 21 is formed by the unetched portion thereof. An n-type current blocking layer 19 and a p-type current blocking layer 20 are formed in this order in the etched portion. A p-type electrode 29 is formed on the bottom surface of the p-type semiconductor substrate 15. When a voltage is applied between the n-type cladding layer 18 and the p-type cladding layer 16, the semiconductor laser 12 oscillates an output beam 27 having a wavelength $\lambda$ from the active layer 17 thereof.

The semiconductor reflecting mirror 13 is formed on a surface 18f of the n-type cladding layer 18 which is the uppermost layer of the semiconductor laser 12. The semiconductor reflecting mirror 13 is composed of a plurality of semiconductor thin films having n-type conductivity and which substantially reflects light with the wavelength $\lambda$. Such a reflecting mirror is known to those skilled in the art as a Distributed Bragg Reflector (DBR). By selecting appropriate refractive indices and film thicknesses for the semiconductor thin films, a reflecting mirror capable of reflecting light having a desired wavelength can be fabricated.

Each of the phototransistors 14a, 14b, 14c, and 14d is located above the stripe 21 of the semiconductor laser 12, and includes a collector layer 22 formed on the semiconductor reflecting mirror 13, a base layer 23 formed on the collector layer 22, and an emitter layer 24 formed on the base layer 23. The base layer 23 substantially absorbs an input beam 28 having the wavelength $\lambda$. A photocurrent is generated by this absorption of the input beam 28, and flows between the collector layer 22 and the emitter layer 24. The emitter layer 24 and the base layer 23 are preferably made of different materials from each other so as to prevent the input beam 28 from being absorbed by the emitter layer 24. Accordingly, the phototransistors 14a, 14b, 14c, and 14d are preferably heterojunction phototransistors.

Each of the phototransistors 14a, 14b, 14c, and 14d has an electrically symmetrical structure. More specifically, the current-voltage characteristic of the phototransistors 14a, 14b, 14c, and 14d obtained when a forward bias voltage is applied between the collector layer 22 and the emitter layer 24 is substantially the same as that obtained when a reverse bias voltage is applied. This feature can be obtained by forming the collector layer 22 and the emitter layer 24 so that they have the same composition, impurity concentration, and thickness. Each of the phototransistors 14a, 14b, 14c, and 14d also includes an n-type electrode 26 with a window 25 formed on the top surface of the emitter layer 24 thereof.

The operation of the optical semiconductor device 11 will be described.

The optical semiconductor device 11 is operated by the application of a DC voltage between the n-type electrode 26 of the phototransistor 14a, 14b, 14c, or 14d and the p-type electrode 29 of the semiconductor laser 12. Under the condition where a reverse bias voltage is applied between the n-type electrode 26 and the p-type electrode 29 so as to apply the emitter layer 24 with a negative bias voltage against the collector layer 22, when the input beam 28 having the wavelength $\lambda$ is received by the base layer 23 through the window 25 of the n-type electrode 26, a current flows from the collector layer 22 to the emitter layer 24 in the phototransistor 14a, 14b, 14c, or 14d. The current also flows from the p-type cladding layer 16 to the n-type cladding layer 18 through the active layer 17 in the optical semiconductor laser 12, so that the semiconductor laser 12 oscillates. Thus, in this case, the current flows from the p-type cladding layer 16 to the emitter layer 24 through the semiconductor reflecting mirror 13. On the other hand, under the condition where a forward bias voltage is applied between the n-type electrode 26 and the p-type electrode 29 so as to apply the emitter layer 24 with a positive bias voltage against the collector layer 22, when the input beam 28 having the wavelength $\lambda$ is received by the base layer 23 through the window 25, a current flows from the emitter layer 24 to the collector layer 22 in the phototransistor 14a, 14b, 14c, or 14d. The current also flows from the n-type cladding layer 18 to the p-type cladding layer 16 through the active layer 17, so that the semiconductor laser 12 is prevented from oscillating. Thus, in this case, the current flows from the emitter layer 24 to the p-type cladding layer 16 through the semiconductor reflecting mirror 13.

Now, referring to FIGS. 1 to 3, the operation of the optical semiconductor device 11 will be described in more detail.

Figure 2:
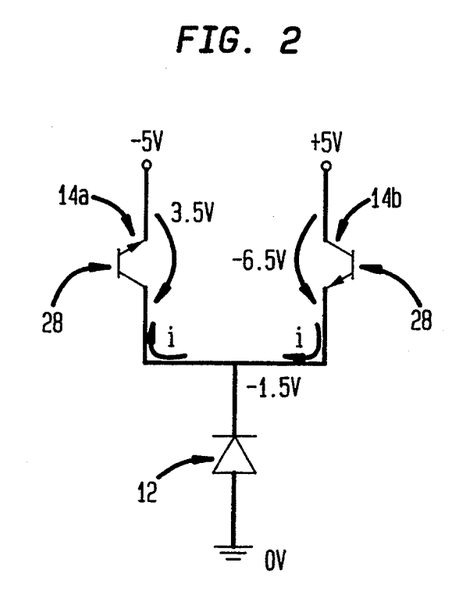
FIG. 2 is an equivalent circuit diagram for describing the operation of the optical semiconductor device of FIG. 1.

FIG. 2 shows part of an equivalent circuit of the optical semiconductor device 11. The phototransistors 14a and 14b are connected in parallel to the semiconductor laser 12. In this equivalent circuit diagram, only the phototransistors 14a and 14b are shown. In practice, however, the phototransistors 14c and 14d are also connected in parallel with the phototransistors 14a and 14b to the semiconductor laser 12. As shown in FIGS. 1 and 2, the p-type electrode 29 of the semiconductor laser 12 is grounded, and a negative voltage, for example $-5$ V, is applied to the n-type electrode 26 of the phototransistor 14a, while a positive voltage, for example $+5$ V, is applied to the n-type electrode 26 of the phototransistor 14b. Since the semiconductor laser 12 can be considered to be a constant voltage source of 1.5 V, for example, the voltages applied across the phototransistors 14a and 14b are 3.5 V and $-6.5$ V, respectively, at the respective emitter layers 24.

Figure 3:
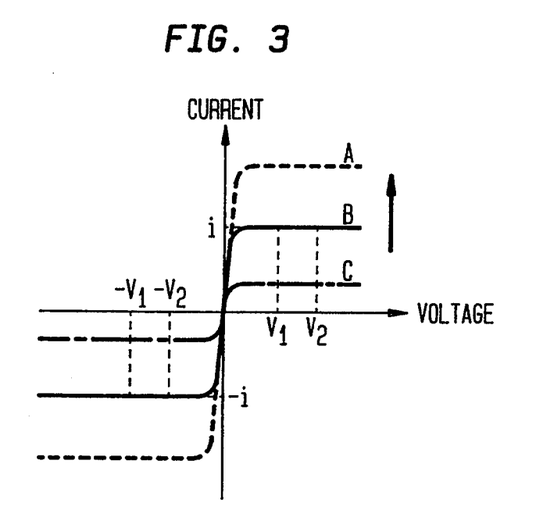
FIG. 3 shows the current-voltage characteristic of a phototransistor of the optical semiconductor device of FIG. 1.

FIG. 3 shows the current-voltage characteristic of the phototransistors 14a and 14b. As is shown by curves A, B, and C, the current flowing in the phototransistors 14a and 14b increases as the intensity of the input beam 28 increases. As is apparent from FIG. 3, for any levels of intensities of the input beam 28 incident to the phototransistors 14a and 14b, the photoelectric transfer gains are the same at the forward biasing and at the reverse biasing. For example, for the input beam 28 having the intensity represented by the curve B, when voltages v1 and $-v1$ are applied across the phototransistors 14a and 14b, currents i and $-i$ having the same intensity flow therein, respectively, in opposite directions. Also, as is apparent from FIG. 3, the photoelectric transfer gain is substantially independent of the bias voltage. For example, for the input beam 28 having the intensity represented by the curve B, whichever voltage v1 or v2 is applied across the phototransistors 14a and 14b, the same current i flows.

Accordingly, when voltages of $-5$ V and $+5$ V are applied to the n-type electrodes 26 of the phototransistors 14a and 14b, respectively, while they are irradiated with the input beams 28 having the same intensity, the currents i and $-i$ having the same intensity flow in opposite directions.

Referring to FIG. 1 again, the semiconductor laser 12 receives through the semiconductor reflecting mirror 13 the sum of the currents which have flown in the phototransistors 14a, 14b, 14c, and 14d. When the sum of the currents exceeds a predetermined threshold level, the semiconductor laser 12 oscillates the output beam 27. In the above case shown in FIG. 2, provided that no current flows in the phototransistors 14c and 14d, the sum of the currents received by the semiconductor laser 12 is zero because the currents flowing in the phototransistors 14a and 14b have the same intensity but the directions thereof are opposite. Thus, no light is emitted from the semiconductor laser 12.

The above-described operation of the phototransistors 14a, 14b, 14c, and 14d corresponds to obtaining the product of the input signal Si and the weight wi represented in Formula (1). In other words, the bias voltage corresponding to the weight wi is applied across the phototransistors 14a, 14b, 14c, and 14d, to which the input beam 28 corresponding to the input signal Si is incident. As a result, the current corresponding to the product of the input signal Si and the weight wi is obtained. Further, the operation of the semiconductor laser 12 corresponds to obtaining the sum $\Sigma(Siwi)$ for the threshold operation. That is, the sum of the currents flowing in the phototransistors 14a, 14b, 14c, and 14d is received by the semiconductor laser 12, and only when the sum of the currents exceeds the threshold level h, the semiconductor laser 12 oscillates. Therefore, this indicates that the optical semiconductor device 11 can effect the operation of the neurochip represented by Formula (1) by itself.

In the optical semiconductor device 11, the weight wi showing the strength of the synaptic interconnection can be changed by changing the polarity of the bias voltage to be applied. This means that the optical semiconductor device 11 has learning capability. The bias voltage may be varied based on the output beam 27, or may be varied so that the output beam 27 with a desirable output can be obtained, which is called "learning with a teacher".

The operation of the optical semiconductor device 11 as the neurochip will be concretely described with reference to Tables 1 and 2 below.

TABLE 1

|  | Phototransistor | | | |
| --- | --- | --- | --- | --- |
|  | 14a | 14b | 14c | 14d |
| Bias voltage (wi) | −5 | 5 | 5 | 5 |
| Optical signal (Si) | O | O | X | O |
| Current (Siwi) | −i | i | 0 | i |
| Sum of current received by semiconductor laser ($\Sigma$Siwi) | | i | | |
| Threshold level (h) | | i < h < 2i | | |
| $\Sigma$Siwi - h | | 0 | | |

In Table 1, it is assumed that the bias voltages, $-5$, 5, 5, and 5 V are applied across the phototransistors 14a, 14b, 14c, and 14d, respectively, as the weight wi. When the phototransistors 14a, 14b, 14c, and 14d are irradiated with light as the input signal si (in Table 1, indicates that the phototransistor is irradiated with light, while X indicates that it is not irradiated with light), the currents (Siwi), $-i$, i, 0, and i flow in the phototransistors 14a, 14b, 14c, and 14d, respectively. As a result, the sum of the currents received by the semiconductor laser 12 as the sum $\Sigma(Siwi)$ is i. Since the current i does not exceed the threshold level h of the semiconductor laser 12 which is i<h<2i, the semiconductor laser 12 does not emit light.

TABLE 2

| | Phototransistor | | | |
|---|---|---|---|---|
| | 14a | 14b | 14c | 14d |
| Bias voltage (wi) | 5 | −5 | 5 | 5 |
| Optical signal (Si) | 0 | 0 | 0 | 0 |
| Current (Siwi) | −i | −i | i | i |
| Sum of current received by semiconductor laser (ΣSiwi) | 2i | | | |
| Threshold level (h) | i < h < 2i | | | |
| ΣSiwi - h | 1 | | | |

In Table 2, it is assumed that the bias voltages, 5, −5, 5, and 5 V are applied across the phototransistors 14a, 14b, 14c, and 14d, respectively, as the weight wi. When the phototransistors 14a, 14b, 14c, and 14d are irradiated with light as the input signal si, the currents (Siwi), i, −i, i, and i flow in the phototransistors 14a, 14b, 14c, and 14d, respectively. As a result, the sum of the currents received by the semiconductor laser 12 as the sum Σ(Siwi) is 2i. Since the current 2i exceeds the threshold level h of the semiconductor laser 12 which is i<h<2i, the semiconductor laser 12 emits light.

The optical semiconductor device 11 of the present invention is advantageous in that, as the neurochip, it can detect the input beam 28 having the same wavelength Σ as that of the output beam 27. Accordingly, the output beam 27 from the optical semiconductor device 11 can be used as input beams for other optical semiconductor devices identical to the optical semiconductor device 11 without the necessity of an external apparatus for converting the wavelength. Thus, a plurality of optical semiconductor devices can be mutually connected to form a neural network. This advantage has been obtained because the semiconductor reflecting mirror 13 which is electrically conductive is formed between the semiconductor laser 12 and the phototransistors 14a, 14b, 14c, and 14d. The semiconductor reflecting mirror 13 reflects internal feedback light which propagates from the active layer 17 vertically with regard to the active layer 17, so as to prevent the internal feedback light from entering the phototransistors 14a, 14b, 14c, and 14d. At the same time, the semiconductor reflecting mirror 13 can reflect light transmitted through the phototransistors 14a, 14b, 14c, and 14d without being absorbed by the base layer 23. Therefore, even if part of light entering the phototransistors 14a, 14b, 14c, and 14d is transmitted without being absorbed by the base layer 23, the part of light is reflected by the semiconductor reflecting mirror 13 and propagates to the base layer 23 again. This improves the photoelectric transfer efficiency. Thus, the semiconductor reflecting mirror 13 optically isolates the phototransistors 14a, 14b, 14c, and 14d from the semiconductor laser 12. This enables location of the phototransistors 14a, 14b, 14c, and 14d above the active layer 17 of the semiconductor laser 12, so that the optical semiconductor device 11 can be made compact.

The optical semiconductor device 11 can be fabricated by a known semiconductor fabrication technique. Referring to FIG. 1, the method for fabricating the optical semiconductor device 11 will be described.

First, the semiconductor laser 12 having the p-type semiconductor substrate 15 is fabricated by liquid phase epitaxy (LPE) or other known techniques. The p-type semiconductor substrate 15 is made of p-type InP with an impurity concentration of $1 \times 10^{18}$ cm$^{-3}$. The p-type cladding layer 16 is made of InP with an impurity concentration of $5 \times 10^{17}$ cm$^{-3}$ and a thickness of 2 μm, and the n-type cladding layer 18 is made of InP with an impurity concentration of $5 \times 10^{16}$ cm$^{-3}$ and a thickness of 2.5 μm. The active layer 17 is made of undoped $In_{0.72}Ga_{0.28}As_{0.6}P_{0.4}$ with an impurity concentration of $1 \times 10^{16}$ cm$^{-3}$ and a thickness of 0.2 μm and has a band gap wavelength of $\lambda = 1.3$ μm. An area of the semiconductor laser 12 including the active layer 17, part of the p-type cladding layer 16, and part of the n-type cladding layer 18 is partly etched so that the stripe 21 having a width Wa of 2 μm can be formed. In the etched portions are buried the n-type current blocking layer 19 and the p-type current blocking layer 20, both of which are made of InP having an impurity concentration of $5 \times 10^{17}$ cm$^{-3}$ and a thickness of 1 μm.

Then, the semiconductor reflecting mirror 13 is formed on the semiconductor laser 12. The semiconductor reflecting mirror 13 is designed to reflect light having a wavelength of 1.3 μm. It is composed of, for example, each 15 of InP layers having a thickness of 101.6 nm, an impurity concentration of $1 \times 10^{17}$ cm$^{-3}$ and a refractive index of 3.20 and $In_{0.72}Ga_{0.28}As_{0.6}P_{0.4}$ layers having a thickness of 93.7 nm, an impurity concentration of $1 \times 10^{17}$ cm$^{-3}$ and a refractive index of 3.47, alternately formed on the n-type cladding layer 18. In order to strictly control the thicknesses, the semiconductor reflecting mirror 13 is preferably formed by molecular beam epitaxy (MBE).

Thereafter, the collector layer 22 is formed on the semiconductor reflecting mirror 13, the base layer 23 on the collector layer 22, and the emitter layer 24 on the base layer 23. The collector layer 22 and the emitter layer 24 both have a thickness of 1.5 μm, and are made of n-type InP having an impurity concentration of $5 \times 10^{17}$ cm$^{-3}$ and p-type InP having an impurity concentration of $5 \times 10^{17}$ cm$^{-3}$, respectively. The base layer 23 is made of $In_{0.72}Ga_{0.28}As_{0.6}P_{0.4}$ having a thickness of 0.3 Nm and an impurity concentration of $1 \times 10^{17}$ cm$^{-3}$. Then the collector layer 22 the base layer 23, and the emitter layer 24 are partly etched so as to form the phototransistors 14a, 14b, 14c, and 14d having a size of L1=L2=60 μm at positions above the stripe 21 of the semiconductor laser 12.

Finally, the n-type electrodes 26 having the windows 25 are formed on the respective emitter layers 24, and the p-type electrode 29 is formed on the p-type semiconductor substrate 15. The thus-fabricated structure is appropriately cut so as to obtain the semiconductor laser 12 having a size of L3=300 μm and L4=150 μm.

Example 2

Figure 4:
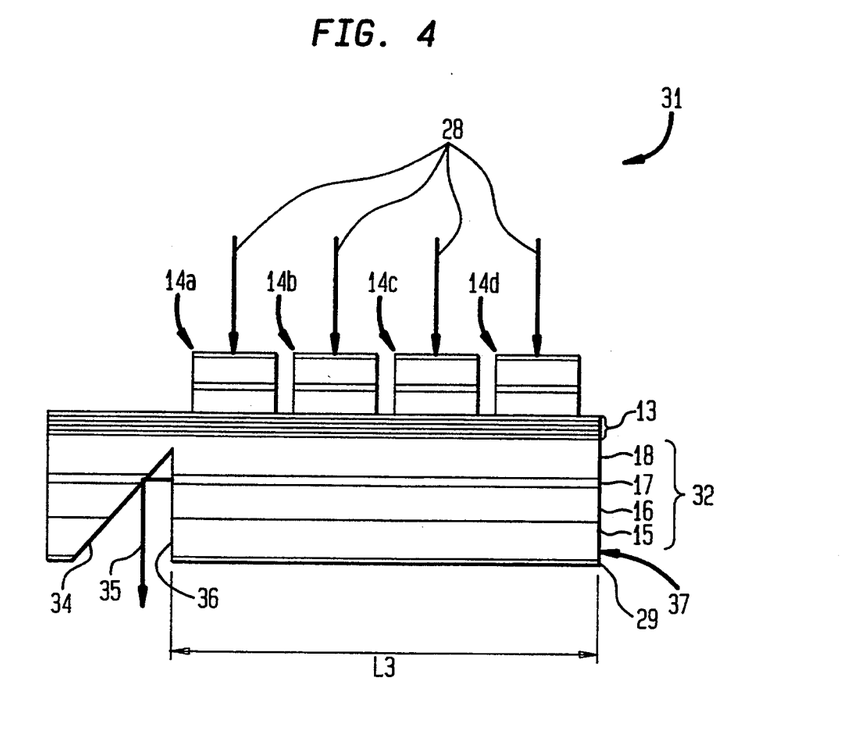
FIG. 4 is a sectional view of a second example of the optical semiconductor device according to the present invention.

FIG. 4 shows a second example of the optical semiconductor device according to the present invention. The same components as those in Example 1 are denoted by the same reference numerals.

An optical semiconductor device 31 of this example includes a semiconductor laser 32, a semiconductor reflecting mirror 13 formed on the semiconductor laser 32, and phototransistors 14a, 14b, 14c, and 14d. formed on the semiconductor reflecting mirror 13.

Unlike the optical semiconductor device 11 of Example 1, the optical semiconductor device 31 includes a 45° mirror 34 for oscillating an output beam 35 in a direction parallel to an input beam 28 incident to the phototransistors 14a, 14b, 14c, and 14d. As in Example 1, the semiconductor laser 32 includes a p-type semiconductor substrate 15, a p-type cladding layer 16 formed on the p-type semiconductor substrate 15, an active layer 17 formed on the p-type cladding layer 16, and an n-type cladding layer 18 formed on the active layer 17. The semiconductor laser 32 has a wedgeshaped cut portion formed by partialy etching the semiconductor laser 32 from the side of a p-type electrode 29 formed on the bottom surface of the p-type semiconductor substrate 15 so as to reach the active layer 17. The cut portion includes an end face 36 cut vertically to the active layer 17 and the 45° mirror 34 cut with an inclination of 45° with regard to the active layer 17. The output beam 35 output from the end face 36 is reflected by the 45° mirror 34 and emitted in a direction vertical to the active layer 17, i.e., in the same direction as the input beam 28. This structure is advantageous when a plurality of optical semiconductor devices identical to the optical semiconductor device 31 are integrated together, especially when they are stacked in the direction of the input beam 28 and the output beam 35.

The 45° mirror 34 can be formed by a known etching technique. A resonator having a length L3 is formed between the end face 36 and an end face 37. An area including the p-type semiconductor substrate 15, the p-type cladding layer 16, the active layer 17, and part of the n-type cladding layer 18 are partly etched so as to form the 45° mirror 34 with an inclination of 45° with regard to the active layer 17. In this example, no reflecting film is formed on the 45° mirror 34. However, a reflecting film made of metal, for example, may be formed to cover the 45° mirror 34.

Example 3

Figure 5A:
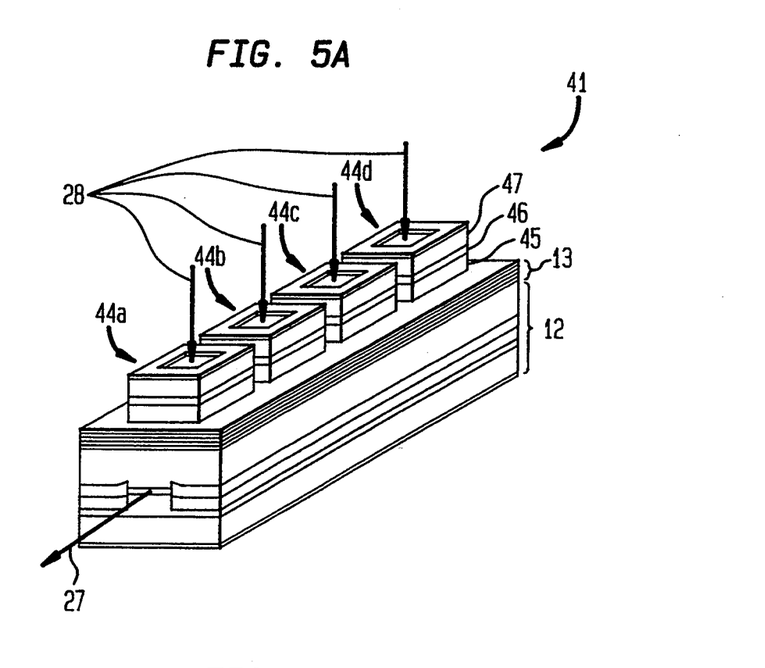
FIG. 5A is a perspective view of a third example of the optical semiconductor device according to the present invention.

FIG. 5A shows a third example of the optical semiconductor device according to the present invention. The same components as those in Example 1 are denoted by the same reference numerals.

An optical semiconductor device 41 of this example includes a semiconductor laser 12, a semiconductor reflecting mirror 13 formed on the semiconductor laser 12, and phototransistors 44a, 44b, 44c, and 44d. formed on the semiconductor reflecting mirror 13.

The optical semiconductor device 41 is different from the semiconductor device 11 of Example 1 in that the phototransistors 44a, 44b, 44c, and 44d of this example have a current-voltage characteristic different from that of the phototransistors 14a, 14b, 14c, and 14d of Example 1.

Figure 5B:
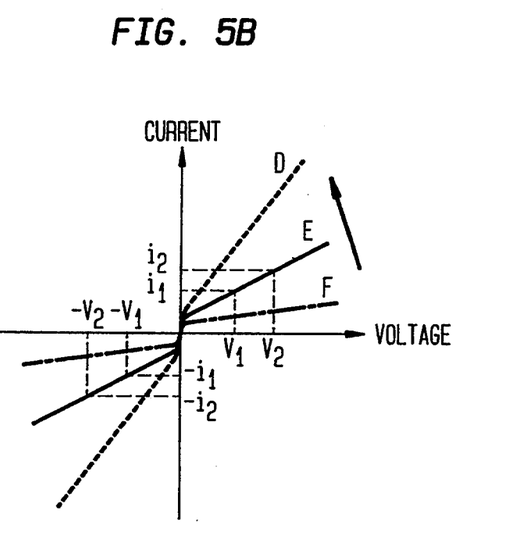
FIG. 5B shows the current-voltage characteristic of a phototransistor of the optical semiconductor device of FIG. 5A.

FIG. 5B shows the current-voltage characteristic of the phototransistors 44a, 44b, 44c, and 44d. The phototransistors 44a, 44b, 44c, and 44d have the current-voltage characteristic represented by curves D, E, and F. As is apparent from FIG. 5B, the photoelectric transfer gains are dependent on the bias voltage. For example, for the input beam 28 having the intensity represented by the curve E, when a voltage v1 is applied across the phototransistor 44a, 44b, 44c, or 44d, a current i1 flows while, when a voltage v2 is applied, a current i2 flows. Also, for any levels of intensities of the input beam 28 incident to the phototransistor 44a, 44b, 44c, or 44d, the photoelectric transfer gains are the same at the forward biasing and at the reverse biasing. For example, for the input beam 28 having the intensity represented by the curve E, when voltages v1 and −v1 are applied across the phototransistor 44a, 44b, 44c, or 44d, currents i1 and −i1 having the same intensity flow therein, respectively, in opposite directions.

In the phototransistors 44a, 44b, 44c, and 44d having the above current-voltage characteristic, the current can be varied in response to the bias voltage. This indicates that the weight wi representing the strength of the synaptic interconnection shown in Formula (1) can be varied successively in response to the bias voltage. As a result, the input signal Si can be multiplied by variable weights wi to obtain an enhanced learning efficiency.

The optical semiconductor device 41 of this example is fabricated as in Example 1. The phototransistors 44a, 44b, 44c, and 44d having the abovedescribed current-voltage characteristic can be formed by using the Early effect of the bipolar transistor. The Early effect occurs when the thickness of a base layer substantially varies as the thickness of a collector depletion layer varies due to the change of the collector voltage. This effect is obtained by thinning the base layer of the bipolar transistor or by reducing the impurity concentration of the base layer. In this example, a collector layer 45 is formed on the semiconductor reflecting mirror 13, a base layer 46 on the collector layer 45, and an emitter layer 47 on the base layer 46. The collector layer 45 and the emitter layer 47 have an identical thickness of 1.5 $\mu$m, and are made of n-type InP having an impurity concentration of $5 \times 10^{17}$ cm$^{-3}$ and p-type InP having an impurity concentration of $5 \times 10^{17}$ cm$^{-3}$ respectively. The base layer 46 has a thickness of 0.2 $\mu$m and is made of $In_{0.72}Ga_{0.28}As_{0.6}P_{0.4}$ having an impurity concentration of $5 \times 10^{16}$ cm$^{-3}$.

Example 4

Figure 6:
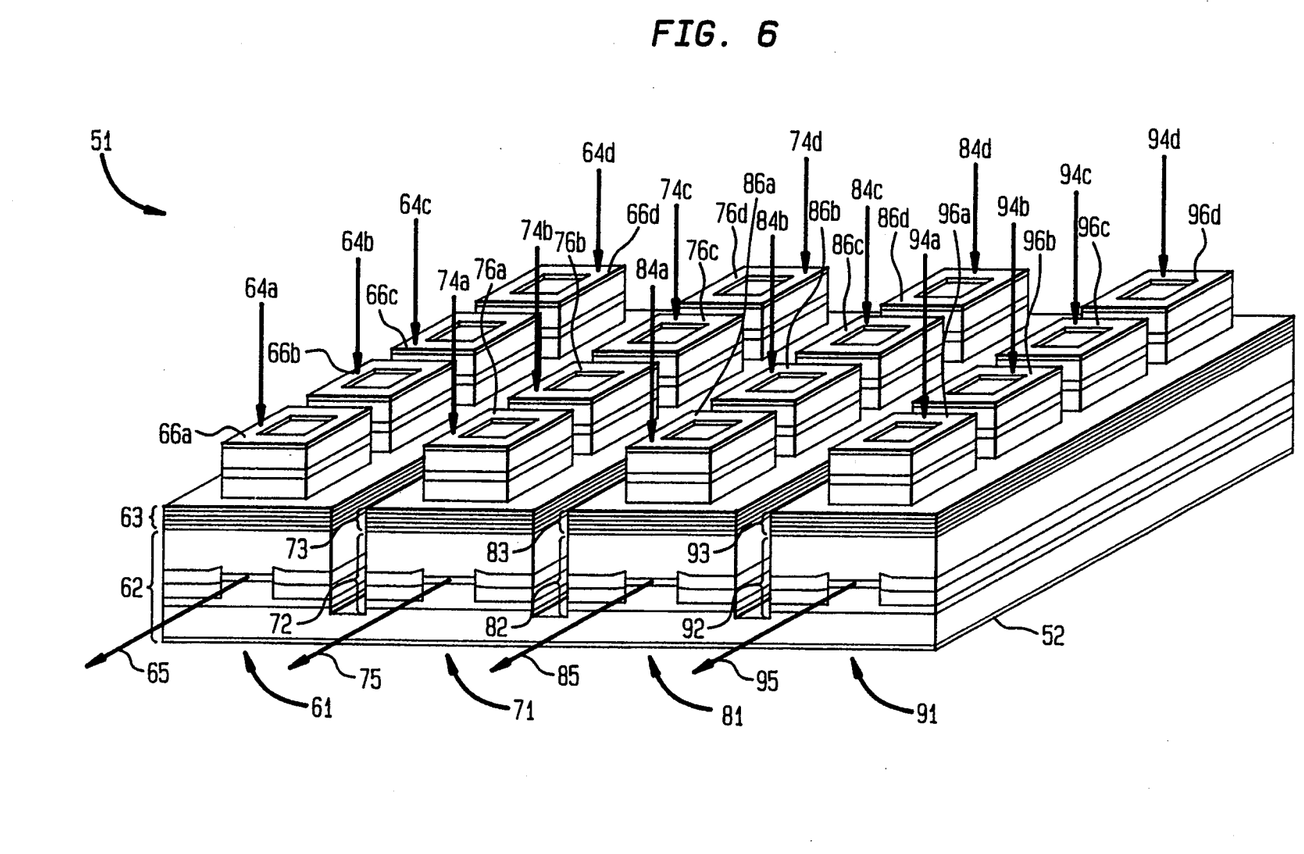
FIG. 6 is a perspective view of a fourth example of the optical semiconductor device according to the present invention.

FIG. 6 shows a fourth example of the optical semiconductor device according to the present invention.

An optical semiconductor device assembly 51 includes optical semiconductor devices 61, 71, 81, and 91 which have substantially the same structure as the optical semiconductor device 11 of Example 1. The optical semiconductor device 61 includes a semiconductor laser 62, a semiconductor reflecting mirror 63 formed on the semiconductor laser 62, and phototransistors 64a, 64b, 64c, and 64d formed on the semiconductor reflecting mirror 63. The optical semiconductor device 71 includes a semiconductor laser 72, a semiconductor reflecting mirror 73 formed on the semiconductor laser 72, and phototransistors 74a, 74b, 74c, and 74d. formed on the semiconductor reflecting mirror 73. The optical semiconductor device 81 includes a semiconductor laser 82, a semiconductor reflecting mirror 83 formed on the semiconductor laser 82, and phototransistors 84a, 84b, 84c, and 84d formed on the semiconductor reflecting mirror 83. The optical semiconductor device 91 includes a semiconductor laser 92, a semiconductor reflecting mirror 93 formed on the semiconductor laser 92, and phototransistors 94a, 94b, 94c, and 94d, formed on the semiconductor reflecting mirror 93.

A common p-type electrode 52 is formed on the bottom surfaces of the semiconductor lasers 62, 72, 82, and 92. The phototransistors 64a to 64d, 74a to 74d, 84a to 84d, and 94a to 94d have n-type electrodes 66a to 66d, 76a to 76d, 86a to 86d, and 96a to 96d on the top surfaces thereof, respectively.

The semiconductor lasers 62, 72, 82, and 92 emit output beams 65, 75, 85, and 95 based on beams incident to the phototransistors 64a to 64d, 74a to 74d, 84a to 84d, and 94a to 94d and bias voltages applied to the n-type electrodes 66a to 66d, 76a to 76d, 86a to 86d, and 96a to 96d, respectively, as described in Example 1.

The optical semiconductor device assembly 51 is capable of forming by itself a neural network using light as the signal. For example, using an optical fiber, the output beam 95 is used as input beams incident to the phototransistors 64d, 74d, 84d, and 94d. Likewise, the output beam 85 is used as input beams incident to the phototransistors 64c, 74c, 84c, and 94c, the output beam 75 as input beams incident to the phototransistors 64b, 74b, 84b, and 94b, and the output beam 65 as input beams incident to the phototransistors 64a, 74a, 84a, and 94a. The structure accomplished by these connections corresponds to a structure where four neurons are optically interconnected. Thus, the information processing by an optical neural network can be realized by one optical semiconductor device assembly 51.

Figure 7:
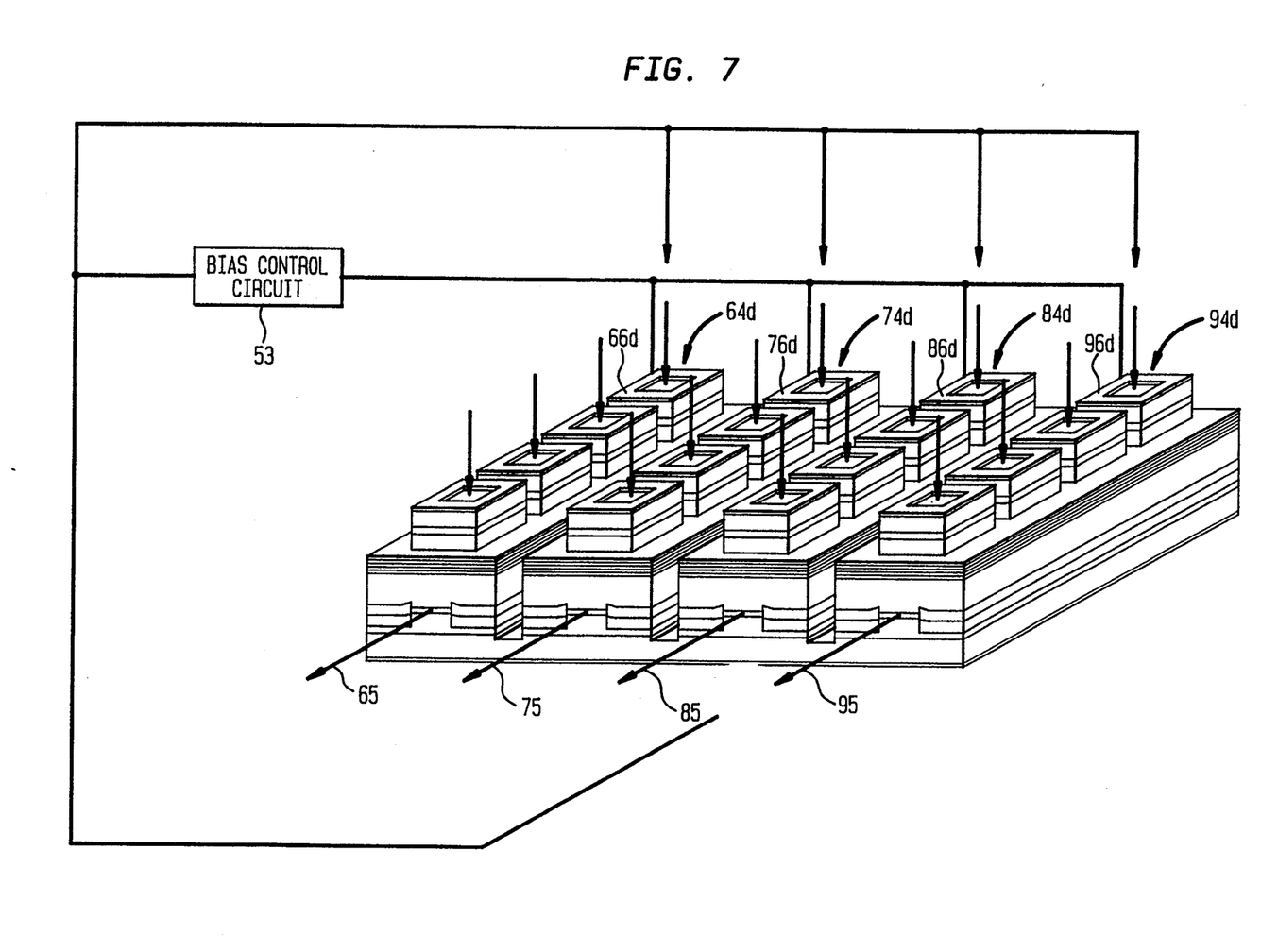
FIG. 7 shows the optical semiconductor device of FIG. 6 is provided with self-learning capability.

The optical semiconductor device assembly 51 can also be provided with a self-learning capability. As shown in FIG. 7, the output beam 95 is input to a bias control circuit 53. A bias voltage based on the output beam 95 is applied to the n-type electrodes 66d, 76d, 86d, and 96d of the phototransistors 64d, 74d, 84d, and 94d. Likewise, bias voltages are applied to the phototransistors 64c, 74c, 84c, and 94c, 64b, 74b, 84b, and 94b, and 64a, 74a, 84a, and 94a based on the output beams 85, 75, and 65, respectively. With these connections, the weight wi can be varied based on the output signal x. Accordingly, the information processing by an optical neural network having self-learning capability can be realized by one optical semiconductor device assembly 51.

In the above examples, the optical semiconductor device has four phototransistors. However, at least two phototransistors are sufficient for the optical semiconductor device of the present invention. Also in the above examples, the n-type semiconductor reflecting mirror was formed on the n-type semiconductor layer of the semiconductor laser, and the npn-type phototransistor was formed on the n-type semiconductor reflecting mirror. However, the optical semiconductor device of the present invention can also be formed of the semiconductor layers having the reverse conductivity types.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical semiconductor device comprising:
a semiconductor laser having at least an active layer;
reflecting means formed on the semiconductor laser for reflecting internal feedback light generated from the semiconductor laser; and
at least two phototransistors formed on the reflecting means for detecting light having a wavelength substantially identical to that of laser light oscillated from the active layer.

2. An optical semiconductor device comprising:
a semiconductor laser having at least an active layer;
reflecting means formed on the semiconductor laser for reflecting internal feedback light generated from the semiconductor laser wherein the reflecting means includes a semiconductor thin-film multilayer reflecting mirror having an electrically conductive property; and
at least two phototransistors formed on the reflecting means for detecting light having a wavelength substantially identical to that of laser light oscillated from the active layer.

3. An optical semiconductor device according to claim 1, wherein the active layer is of a stripe shape, and the phototransistors are located above the active layer.

4. An optical semiconductor device according to claim 1, wherein the phototransistors detect light incident vertically to a direction of resonance of the active layer.

5. An optical semiconductor device according to claim 4, further comprising second reflecting means for oscillating the laser light in a direction parallel to the incident light.

6. An optical semiconductor device according to claim 1, wherein the phototransistors have an identical photoelectric transfer gain at forward biasing and at reverse biasing.

7. An optical semiconductor device according to claim 6, wherein the phototransistors have a constant photoelectric transfer gain independent of a variation in the bias voltage.

8. An optical semiconductor device according to claim 6, wherein the phototransistors have a photoelectric transfer gain dependent on a variation in the bias voltage.

9. An optical semiconductor device comprising:
a plurality of semiconductor lasers each having at least an active layer;
reflecting means formed on each of the plurality of semiconductor lasers for reflecting internal feedback light generated from the semiconductor laser; and
at least two phototransistors formed on each reflecting means for detecting light having a wavelength substantially identical to that of laser light oscillated from the active layer.

10. An optical semiconductor device comprising:
a plurality of semiconductor lasers each having at least an active layer;
reflecting means formed on each of the plurality of semiconductor lasers for reflecting internal feedback light generated from the semiconductor laser wherein the reflecting means includes a semiconductor thin-film multilayer reflecting mirror having an electrically conductive property; and
at least two phototransistors formed on the reflecting means for detecting light having a wavelength substantially identical to that of laser light oscillated from the active layer.

11. An optical semiconductor device according to claim 9, wherein the active layer is of a stripe shape, and the phototransistors are located above the active layer.

12. An optical semiconductor device according to claim 9, wherein the phototransistors detect light incident vertically to a direction of resonance of the active layer.

13. An optical semiconductor device according to claim 12, further comprising second reflecting means for oscillating the laser light in a direction parallel to the incident light.

14. An optical semiconductor device according to claim 9, wherein the phototransistors have an identical photoelectric transfer gain at forward biasing and at reverse biasing.

15. An optical semiconductor device according to claim 14, wherein the phototransistors have a constant photoelectric transfer gain independent of a variation in the bias voltage.

16. An optical semiconductor device according to claim 14, wherein the phototransistors have a photoelectric transfer gain dependent on a variation in the bias voltage.

17. An optical neurochip comprising:
a plurality of optical semiconductor devices each including;
a plurality of semiconductor lasers each having at least an active layer;
reflecting means formed on each of the plurality of semiconductor lasers for reflecting internal feedback light generated from the semiconductor laser;
at least two phototransistors formed on each reflecting means for detecting light having a wavelength substantially identical to that of laser light oscillated from the active layer; voltage application means for applying bias voltages to the phototransistors; and
a bias control circuit optically connected to each of the semiconductor lasers and each of the phototransistors, for detecting light oscillated from the semiconductor laser and applying a voltage corresponding to the intensity of the detected light to the voltage application means.

* * * * *